United States Patent
Tao et al.

(10) Patent No.: US 6,693,364 B2
(45) Date of Patent: Feb. 17, 2004

(54) OPTICAL INTEGRATED CIRCUIT ELEMENT PACKAGE AND PROCESS FOR MAKING THE SAME

(75) Inventors: Su Tao, Kaohsiung (TW); Kuo Chung Yee, Taipei (TW); Jen Chieh Kao, Kaohsiung (TW); Chih Lung Chen, Fengshan (TW); Hsing Jung Liau, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/355,152

(22) Filed: Jan. 31, 2003

(65) Prior Publication Data

US 2003/0234452 A1 Dec. 25, 2003

(30) Foreign Application Priority Data

Jun. 20, 2002 (TW) ...................................... 091107808 A

(51) Int. Cl.⁷ ......................... H01L 23/48; H01L 23/52; H01L 29/40
(52) U.S. Cl. ....................... 257/783; 257/686; 257/777; 438/118
(58) Field of Search .................. 257/686, 685, 257/777, 783, 438, 433; 438/118, 65, 69

(56) References Cited

U.S. PATENT DOCUMENTS

| | | | | |
|---|---|---|---|---|
| 5,657,409 A | * | 8/1997 | Raskin et al. | |
| 5,801,448 A | * | 9/1998 | Ball | |
| 5,952,725 A | * | 9/1999 | Ball | |
| 6,011,301 A | * | 1/2000 | Chiu | |
| 6,051,848 A | | 4/2000 | Webb | |
| 6,150,724 A | * | 11/2000 | Wenzel et al. | |
| 6,310,403 B1 | * | 10/2001 | Zhang et al. | |
| 6,521,483 B1 | * | 2/2003 | Hashimoto | |
| 6,623,178 B1 | * | 9/2003 | Sakurai et al. | |

* cited by examiner

*Primary Examiner*—Sheila V. Clark
(74) *Attorney, Agent, or Firm*—Lowe Hauptman Gilman & Berner LLP

(57) ABSTRACT

An optical integrated circuit element package comprises a substrate, an upper chip, a lower chip, an optical-transparent underfill, and a sealing compound. The substrate has a plurality of solder balls disposed on a surface of the substrate, a plurality of bonding pads electrically connected to the solder balls, a cover attached to the other surface of the substrate, and a cavity to expose the cover. The upper chip is provided with a plurality of bumps and is adhered to the exposed cover in the cavity by a thermal gap fill. The lower chip has a plurality of bonding pads electrically connected to the plurality of bumps of the upper chip and has a plurality of bumps electrically connected to the plurality of bonding pads of the substrate. The optical-transparent underfill is disposed between the lower chip and the upper chip. The sealing compound hermetically seals the space between the lower chip and the substrate.

14 Claims, 3 Drawing Sheets

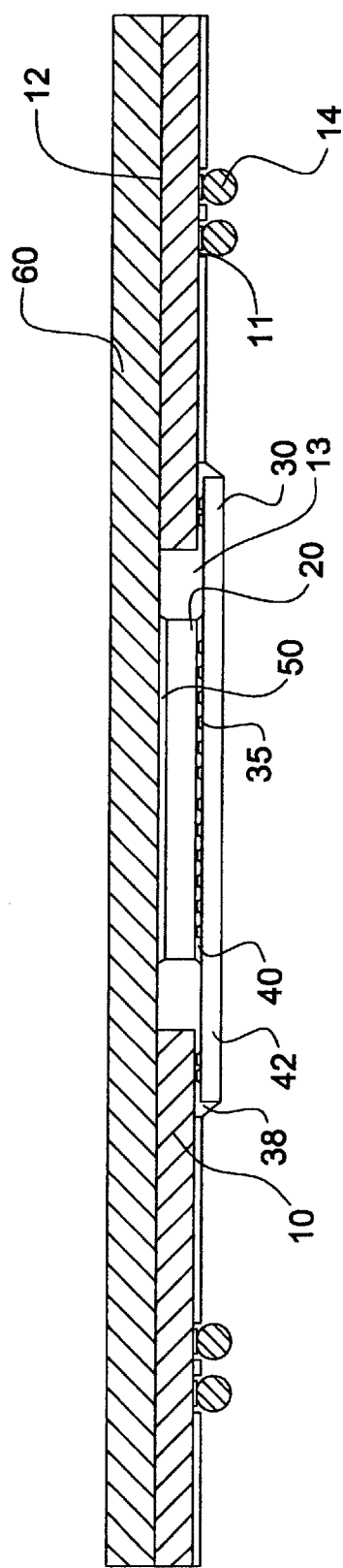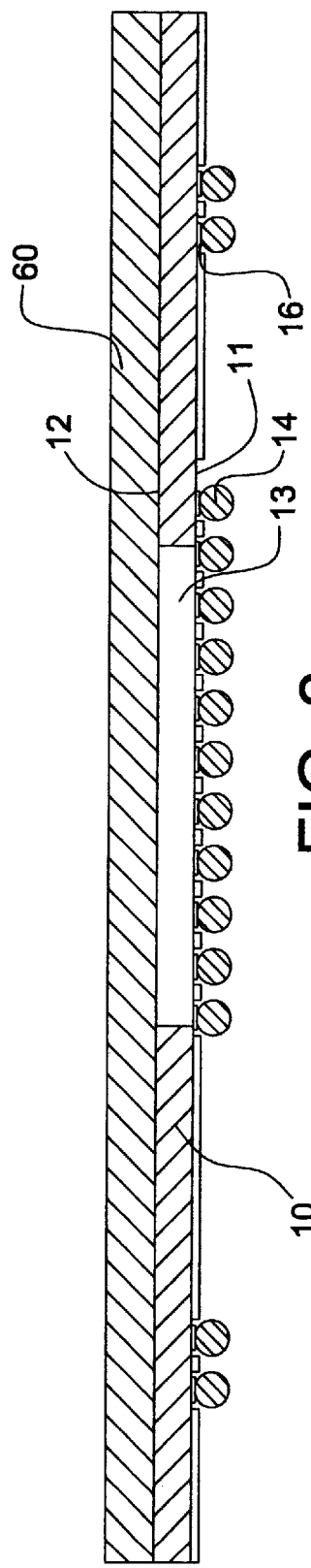

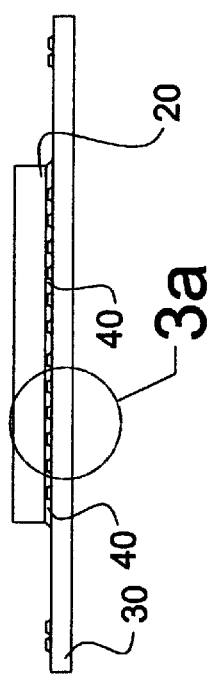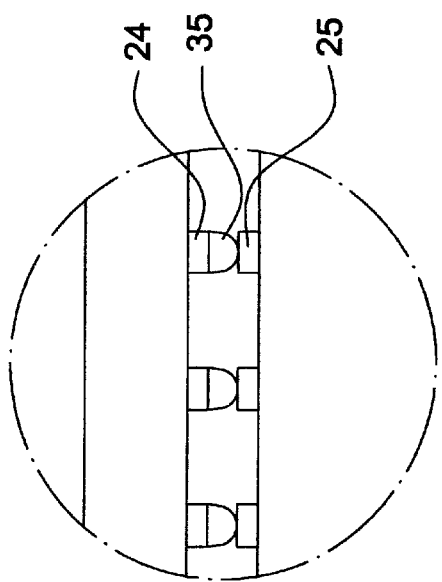

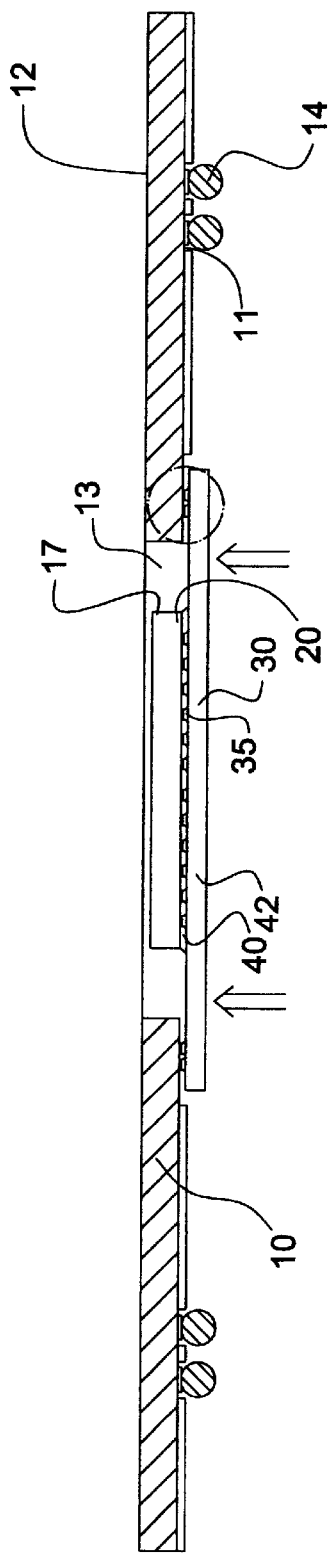
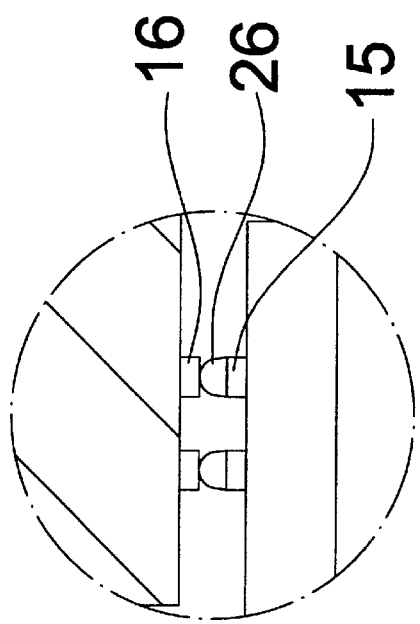
FIG. 4
FIG. 4a

OPTICAL INTEGRATED CIRCUIT ELEMENT PACKAGE AND PROCESS FOR MAKING THE SAME

BACKGROUND OF THE INVENTION

1. Field of the Invention

The present invention generally relates to an optical integrated circuit element package, and more particularly relates to an optical integrated circuit element package with ball grid array.

2. Description of the Related Art

With the progress of the photo-electric technology, more and more photo-electric devices (e.g. light emitting devices or photosensitive devices) have been wildly used in a variety of optical product such as scanners, computer code bar readers, digital communication systems and others. In typical photo-electric applications, a photo-electric device in the form of integrated, circuit chip is disposed on a package having a sealed transparent window. Light beams pass through and into the sealed transparent window according to optical theory such that the photosensitive device can detect optical signals, or such that the light beams generated by light emitting device emit out through the window.

In the prior art, there have been many photo-electric device packages with respect to the form of integrated circuit chip. For example, U.S. Pat. No. 6,051,848 entitled "Optical device packages containing an optical transmitter die" issued to Webb on Apr. 18, 2000, has disclosed an optical device including an optical transmitter die and a package having mold material which encapsulates the optical transmitter die. However, the package manufacturing process generally uses conventional method including die attaching, wire bonding, molding and lead-bending, which therefore needs high cost, large space and much time in such package manufacturing process.

Further, it has been concerned how to readily and effectively dissipate the heat generated by the integrated circuit chip from the package. Also, in order to meet the requirement of electronic unit of low profile, the multichip module with higher density has become current trend for developing the package.

Therefore, there exists a need for the optical device package manufacturer to provide an optical device package with satisfactory low profile and low manufacturing cost, as well as able to provide semiconductor component with high-density fabrication.

SUMMARY OF THE INVENTION

It is an object of the present invention to provide an optical integrated circuit element package providing satisfactory low profile, high-density fabricated structure, good heat-dissipated ability, and low manufacturing cost.

It is another object of the present invention to provide a process for making optical integrated circuit element package wherein the package provides satisfactory low profile, high-density fabricated structure, good heat-dissipated ability, and low manufacturing cost.

In order to achieve the objects mentioned hereinabove, the present invention provides an optical integrated circuit element package comprising: a substrate having a plurality of solder balls disposed on one surface of the substrate, a plurality of bonding pads electrically connected to the solder balls, a cover attached to the other surface of the substrate, and a cavity to expose the cover; an upper chip provided with a plurality of bumps and adhered to the exposed cover in the cavity by a thermal gap fill; a lower chip having a plurality of bonding pads electrically connected to the plurality of bumps of the upper chip and having a plurality of bumps electrically connected to the plurality of bounding pads of the substrate; an optical-transparent underfill disposed between the lower chip and the upper chip; and a sealing compound hermetically seals the space between the lower chip and the substrate.

The present invention further provides a process for making an optical integrated circuit element package wherein the process comprises following steps: providing a substrate having a plurality of solder balls disposed on one surface of the substrate, a plurality of bonding pads electrically connected to the solder balls, a cover attached to the other surface of the substrate, and a cavity to expose the cover; providing an upper chip provided with a plurality of bumps; providing a lower chip having a plurality of bonding pads and a plurality of bumps; connecting the upper chip to the lower chip and electrically connecting the plurality of bumps of the upper chip to the plurality of bonding pads of the lower chip; filling the space between the lower chip and the upper chip with an optical-transparent underfill; connecting the lower chip to the substrate and electrically connecting the plurality of the bumps of the lower chip to the plurality of bonding pads of the substrate, and filling the space between the upper chip and the cover with a thermal gap fill.

As mentioned above, the optical element package according to the present invention is a thermo enhanced ball grid array package. The chip having the optical element directly contacts a heat-sinking cover by means of the thermal gap fill, thereby providing a fast heat-dissipating path. Furthermore, in the package according to the present invention, the chip having the optical element is packaged by the flip chip method such that the wire bonding process is eliminated so as to decrease manufacturing cost and to achieve high-density package.

BRIEF DESCRIPTION OF THE DRAWINGS

Other objects, advantages, and novel features of the invention will become more apparent from the following detailed description when taken in conjunction with the accompanying drawings.

FIG. 1 is a cross-sectional view of an optical integrated circuit element package according to a preferred embodiment of the present invention.

FIG. 2 is a cross-sectional view of a substrate according to the embodiment of the present invention.

FIG. 3 is a cross-sectional view of a connection between the upper chip and lower chip according to the embodiment of the present invention.

FIG. 3a is a partially enlarged view of region 3a as shown in FIG. 3

FIG. 4 is a view showing the connection of the combination, the upper chip with the lower chip shown in FIG. 3, and the substrate shown in FIG. 2.

FIG. 4a is a partially enlarged view of region 4a as shown in FIG. 4

DESCRIPTION OF THE PREFERRED EMBODIMENT

While the present invention is susceptible of embodiments in various forms, there is shown in the drawings and will hereinafter be described a presently preferred embodiment with the understanding that the present disclosure is to be considered an exemplification of the invention and is not intended to limit the invention to the drawings and/or the specific embodiment illustrated.

Now referring to FIG. 1, an optical integrated circuit element package, according to a preferred embodiment of the present invention, mainly comprises a substrate 10, an upper chip 20, a lower chip 30, and a cover 60.

The substrate 10 has a first surface 11 on which a plurality of solder balls 14 is disposed, a second surface 12 for being attached to the cover 60, and a rectangular cavity 13 (as show in FIG. 2).

The upper chip 20 has a photo-electric device such as vertical cavity surface emitting laser driver (VCSEL Driver) chip or optical receiver chip. The active surface of the upper chip 20 has a plurality of bumps 35 (as show in FIG. 3a) electrically connected to a plurality of bonding pads 25 on the active surface of the lower chip 30. The lower chip 30 comprises an optical-transparent substrate 42 on which there can be formed with a variety of active devices such as the circuit driver of the photo-electric device, analog-to-digital or digital-to-analog converted circuit, and EEPROM. The optical-transparent substrate 42 can be a sapphire substrate, glass substrate, quartz, and transparent plastic substrate. The bumps 35 of the upper chip 20 are formed by gold (AU) or solder. The lower chip 30 has a plurality of bumps 26 (as show in FIG. 4b) for being electrically connected to the plurality of bonding pads 16 on the first surface 11 of the substrate 10 (as show in FIG. 4b). One skilled in the art will appreciate that the bumps 35, 26 are respectively formed upon bonding pads 24 of the upper chip 20 and bonding pads 15 of the lower chip 30 (as show in FIG. 4a and FIG. 4b). As show in FIG. 1, the lower chip 30 covers the cavity 13 of the substrate 10.

An optical-transparent underfill 40 is filled between the lower chip 30 and the upper chip 20 for resisting the permeation of moisture so as to avoid short circuit. A sealing compound 38 hermetically seals the space between the surroundings of the lower chip 30 and the surroundings of the cavity 13 of the substrate 10. A thermal gap fill 50 is filled between the upper chip 20 and the cover 60. The cover 60 is generally formed by mental material having good heat conductivity such as copper, aluminum, and others, and the thermal gap fill 50 has good heat conductivity so as to fast dissipate the heat generated by the upper chip 20 through the cover 60.

One skilled in the art will appreciate that the optical integrated circuit element package according to the present invention can be utilized to be connected to several optical elements such as optical fiber, waveguide, reflecting mirror, or lens whereby electrical signals of the substrate can be operatively interactive with the optical signals of the optical elements.

Now referring to FIGS. 2 to 5, they show the process for making an optical integrated circuit element package according to the present invention. As shown in FIG. 2, a substrate 10 has a first surface 11 on which a plurality of solder balls 14 is disposed, a second surface 12 for being attached to the cover 60, and a rectangular cavity 13. Furthermore, the substrate 10 further comprises a plurality of bonding pads 16 disposed on the first surface 11 of the substrate 10. The substrate 10 is generally the printed circuit board formed by enhanced fiberglass bismaleimide-triazine (BT) resin.

Now referring to FIGS. 3 and 3a, an active surface of the upper chip 20 has a plurality of bonding pads 24 on which a plurality of bumps 35 are formed. The active surface of the lower chip 30 has a plurality of bonding pads 25 thereon. The bumps 35 are, electrically connected to the corresponding bonding pads 25 of the lower chip 30 through thermal compression processes. An optical-transparent underfill 40 is filled into the space between the upper chip 20 and lower chip 30 for resisting the permeation of moisture so as to increasing the anti-fatigue life of the bumps 35. Preferably, the refractive index of the optical-transparent fill 40 ranges between 1.4 and 1.6.

Further referring to FIGS. 4 and 4a, at the periphery of the lower chip 30 are disposed a plurality of bonding pads 15 on which a plurality of bumps 26 are formed. The bumps 26 are electrically connected to the bonding pads 16 of the substrate 10 through thermal compression processes. One skilled in the art will appreciate that a sealing compound 38 hermetically seals the space between the surroundings of the lower chip 30 and the surroundings of the cavity 13 of the substrate 10, and a thermal gap fill 50 is coated on the backside of the upper chip 20 so as to be attached to the cover 60 whereby the optical integrated circuit element package, according to the present invention, can be achieved.

It should be noted, one skilled in the art will appreciate that the cover 60 is formed by good heat-dissipated metal material and attached to the substrate 10 by the process such as adhesion. Further, the cover 60 can be also attached to the substrate 10 after the lower chip 30 is attached to the substrate 10. The upper chip 20 can be coated with the thermal gap fill 50 by which the upper chip 20 is attached to the cavity 13 portion of the substrate 10.

Moreover, one skilled in the art will appreciate that the optical-transparent substrate of the lower chip 30 has an open window through which the optical element of the upper chip 20 can be able to receive or dissipate the light.

As mentioned about, the optical integrated circuit element package, according to the present invention, has good heat-dissipated ability so as to fast dissipate the heat generated by the chip from the cover.

While the foregoing description and drawings represent the embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components. The presently disclosed embodiments are therefore to be considered in all respects as illustrative and not restrictive, the scope of the invention being indicated by the appended claims and their legal equivalents, and not limited to the foregoing description.

What is claimed is:

1. An optical integrated circuit element package, comprising:
   a substrate having a plurality of solder balls disposed on a surface of the substrate, a plurality of bonding pads electrically connected to the solder balls, a cover attached to the other surface of the substrate, and a cavity to expose the cover;
   an upper chip provided with a plurality of bumps and adhered to the exposed cover in the cavity by a thermal gap fill;
   a lower chip having a plurality of bonding pads electrically connected to the plurality of bumps of the upper chip and having a plurality of bumps electrically connected to the plurality of bounding pads of the substrate;

an optical-transparent underfill disposed between the lower chip and the upper chip; and a sealing compound hermetically sealing the space between the lower chip and the substrate.

2. The optical integrated circuit element package according to claim 1, wherein the upper chip has photo-electric devices.

3. The optical integrated circuit element package according to claim 1, wherein the upper chip is a vertical cavity surface emitting laser driver (VCSEL) chip.

4. The optical integrated circuit element package according to claim 1, wherein the upper chip is an optical receiver chip.

5. The optical integrated circuit element package according to claim 1, wherein the lower chip is an optical-transparent substrate having electric circuit elements.

6. The optical integrated circuit element package according to claim 5, wherein the optical-transparent substrate is a sapphire substrate.

7. The optical integrated circuit element package according to claim 1, wherein the refractive index of the optical-transparent fill ranges between 1.4 and 1.6.

8. A process for making an optical integrated circuit element package, comprising the following steps:

providing a substrate having a plurality of solder balls disposed on a surface of the substrate, a plurality of bonding pads electrically connected to the solder balls, a cover attached to the other surface of the substrate, and a cavity to expose the cover;

providing an upper chip provided with a plurality of bumps;

providing a lower chip having a plurality of bonding pads and a plurality of bumps;

connecting the upper chip to the lower chip and electrically connecting the plurality of bumps of the upper chip to the plurality of bonding pads of the lower chip;

filling the space between the lower chip and the upper chip with an optical-transparent underfill;

connecting the lower chip to the substrate and electrically connecting the plurality of the bumps of the lower chip to the plurality of bonding pads of the substrate, and filling the space between the upper chip and the cover with a thermal gap fill.

9. The process according to claim 8, wherein the upper chip has photo-electric devices.

10. The process according to claim 8, wherein the upper chip is a vertical cavity surface emitting laser driver (VCSEL) chip.

11. The process according to claim 8, wherein the upper chip is an optical receiver chip.

12. The process according to claim 8, wherein the lower chip is an optical-transparent substrate having electric circuit elements.

13. The process according to claim 12, wherein the optical-transparent substrate is a sapphire substrate.

14. The process according to claim 12, wherein the refractive index of the optical-transparent fill ranges between 1.4 and 1.6.

* * * * *